United States Patent
Hudson

(10) Patent No.: US 9,177,762 B2
(45) Date of Patent: Nov. 3, 2015

(54) SYSTEM, METHOD AND APPARATUS OF A WEDGE-SHAPED PARALLEL PLATE PLASMA REACTOR FOR SUBSTRATE PROCESSING

(75) Inventor: Eric Hudson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1002 days.

(21) Appl. No.: 13/308,989

(22) Filed: Dec. 1, 2011

(65) Prior Publication Data

US 2013/0119020 A1    May 16, 2013

Related U.S. Application Data

(60) Provisional application No. 61/560,292, filed on Nov. 16, 2011.

(51) Int. Cl.
*H01J 37/32* (2006.01)

(52) U.S. Cl.
CPC ..... *H01J 37/32623* (2013.01); *H01J 37/32091* (2013.01); *H01J 37/32651* (2013.01)

(58) Field of Classification Search
CPC ............ H01J 37/32376; H01J 37/32651
See application file for complete search history.

(56) References Cited

U.S. PATENT DOCUMENTS

| | | |
|---|---|---|
| 4,209,357 A | 6/1980 | Gorin et al. |
| 4,276,557 A | 6/1981 | Levinstein et al. |
| 4,340,462 A | 7/1982 | Koch |
| 5,108,778 A | 4/1992 | Suzuki et al. |
| 5,183,990 A | 2/1993 | Enyedy |
| 5,302,237 A | 4/1994 | Larson et al. |
| 5,349,271 A | 9/1994 | Van Os et al. |
| 5,353,314 A | 10/1994 | Schaffer |
| 5,505,780 A | 4/1996 | Dalvie et al. |
| 5,620,524 A | 4/1997 | Fan et al. |
| 5,630,880 A | 5/1997 | Eastlund |
| 5,651,867 A | 7/1997 | Kokadu et al. |

(Continued)

FOREIGN PATENT DOCUMENTS

| | | |
|---|---|---|
| EP | 1 155 164 B1 | 7/2010 |
| JP | 61189642 A | 8/1986 |

(Continued)

OTHER PUBLICATIONS

PCT International Search Report—PCT/US2012/065333—(dated Jan. 28, 2013) (3 pages).

(Continued)

*Primary Examiner* — Maureen Passey
(74) *Attorney, Agent, or Firm* — Martine Penilla Group, LLC

(57) ABSTRACT

A plasma process chamber includes a top electrode, a bottom electrode disposed opposite the top electrode, the bottom electrode capable of supporting a substrate. The plasma process chamber also includes a plasma containment structure defining a plasma containment region, the plasma containment region being less than an entire surface of the substrate. The plasma containment structure rotates relative to the substrate and wherein the plasma containment region includes a center point of the substrate throughout the rotation of the plasma containment structure relative to the substrate. The plasma containment structure includes multiple gaps. A vacuum source is coupled to the gaps in the plasma containment structure. A method of processing a substrate is also described.

14 Claims, 15 Drawing Sheets

(56) References Cited

U.S. PATENT DOCUMENTS

| | | | |
|---|---|---|---|
| 5,904,780 A | 5/1999 | Tomoyasu | |
| 5,998,933 A | 12/1999 | Shun'ko | |
| 6,150,628 A | 11/2000 | Smith et al. | |
| 6,190,236 B1 | 2/2001 | Drill | |
| 6,335,293 B1 | 1/2002 | Luo et al. | |
| 6,337,460 B2 | 1/2002 | Kelkar et al. | |
| 6,388,226 B1 | 5/2002 | Smith et al. | |
| 6,392,351 B1 | 5/2002 | Shun'ko | |
| 6,432,260 B1 | 8/2002 | Mahoney et al. | |
| 6,444,137 B1 | 9/2002 | Collins et al. | |
| 6,527,911 B1 | 3/2003 | Yen et al. | |
| 6,641,698 B2 | 11/2003 | Kabansky | |
| 6,755,150 B2 | 6/2004 | Lai et al. | |
| 6,761,804 B2 | 7/2004 | Perrin | |
| 6,825,618 B2 | 11/2004 | Pu et al. | |
| 6,830,652 B1 | 12/2004 | Ohmi et al. | |
| 6,836,073 B2 | 12/2004 | Matsushita | |
| 6,837,967 B1 * | 1/2005 | Berman et al. | 156/345.3 |
| 6,851,384 B2 | 2/2005 | Yuda et al. | |
| 6,855,906 B2 | 2/2005 | Brailove | |
| 6,872,259 B2 | 3/2005 | Strang | |
| 6,924,455 B1 | 8/2005 | Chen et al. | |
| 6,936,546 B2 | 8/2005 | Robins | |
| 6,962,644 B2 | 11/2005 | Paterson et al. | |
| 6,988,327 B2 | 1/2006 | Garcia et al. | |
| 7,069,937 B2 | 7/2006 | Garcia et al. | |
| 7,198,055 B2 | 4/2007 | Woods et al. | |
| 7,217,337 B2 | 5/2007 | Choi | |
| 7,234,477 B2 | 6/2007 | De Lararios et al. | |
| 7,363,876 B2 | 4/2008 | Lai et al. | |
| 7,411,352 B2 | 8/2008 | Madocks | |
| 7,513,262 B2 | 4/2009 | Woods | |
| 7,645,495 B2 | 1/2010 | Dings et al. | |
| 7,785,672 B2 | 8/2010 | Choi et al. | |
| 7,895,970 B2 | 3/2011 | Honda et al. | |
| 8,056,503 B2 | 11/2011 | Kikuchi et al. | |
| 8,169,148 B2 | 5/2012 | Jeon et al. | |
| 2001/0000104 A1 | 4/2001 | Li et al. | |
| 2001/0002582 A1 | 6/2001 | Dunham | |
| 2001/0003271 A1 | 6/2001 | Otsuki | |
| 2001/0006093 A1 | 7/2001 | Tabuchi et al. | |
| 2001/0023741 A1 | 9/2001 | Collison et al. | |
| 2001/0047760 A1 | 12/2001 | Moslehi | |
| 2001/0051439 A1 | 12/2001 | Khan et al. | |
| 2002/0030167 A1 | 3/2002 | Liebert et al. | |
| 2002/0101167 A1 | 8/2002 | Shan et al. | |
| 2002/0104821 A1 | 8/2002 | Bazylenko et al. | |
| 2002/0121345 A1 | 9/2002 | Chen et al. | |
| 2003/0015965 A1 | 1/2003 | Godyak | |
| 2003/0071035 A1 | 4/2003 | Brailove | |
| 2003/0106647 A1 | 6/2003 | Koshiishi et al. | |
| 2003/0188685 A1 | 10/2003 | Wang et al. | |
| 2003/0213560 A1 | 11/2003 | Wang et al. | |
| 2004/0018320 A1 | 1/2004 | Nicolussi | |
| 2004/0027781 A1 | 2/2004 | Hanawa et al. | |
| 2004/0047720 A1 | 3/2004 | Lerner et al. | |
| 2004/0175953 A1 | 9/2004 | Ogle | |
| 2004/0231799 A1 | 11/2004 | Lee et al. | |
| 2004/0238123 A1 | 12/2004 | Becknell et al. | |
| 2004/0238124 A1 | 12/2004 | Nakamura | |
| 2005/0000655 A1 | 1/2005 | Wi | |
| 2005/0001556 A1 | 1/2005 | Hoffman et al. | |
| 2005/0103620 A1 | 5/2005 | Chistyakov | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2005/0279458 A1 | 12/2005 | Okumura et al. | |
| 2006/0065623 A1 | 3/2006 | Guiney et al. | |
| 2006/0236931 A1 | 10/2006 | Singh et al. | |
| 2006/0289409 A1 | 12/2006 | Choi et al. | |
| 2007/0017636 A1 | 1/2007 | Goto et al. | |
| 2007/0032081 A1 | 2/2007 | Chang et al. | |
| 2007/0081295 A1 | 4/2007 | Brillhart et al. | |
| 2007/0163440 A1 | 7/2007 | Kim et al. | |
| 2007/0212484 A1 | 9/2007 | Li | |
| 2007/0251642 A1 | 11/2007 | Bera et al. | |
| 2007/0277930 A1 | 12/2007 | Yokoyama et al. | |
| 2007/0289710 A1 | 12/2007 | Hudson et al. | |
| 2008/0020574 A1 | 1/2008 | Marakhtanov et al. | |
| 2008/0041820 A1 | 2/2008 | Tong et al. | |
| 2008/0099145 A1 | 5/2008 | Keller | |
| 2008/0110860 A1 | 5/2008 | Miller et al. | |
| 2008/0173237 A1 | 7/2008 | Collins et al. | |
| 2008/0179007 A1 | 7/2008 | Collins et al. | |
| 2008/0179546 A1 | 7/2008 | Lee et al. | |
| 2008/0286489 A1 | 11/2008 | Wang et al. | |
| 2008/0286697 A1 | 11/2008 | Verhaverbeke et al. | |
| 2008/0302652 A1 | 12/2008 | Entley et al. | |
| 2009/0015165 A1 | 1/2009 | Jeon et al. | |
| 2009/0025879 A1 | 1/2009 | Rauf et al. | |
| 2009/0061087 A1 | 3/2009 | Endo et al. | |
| 2009/0061542 A1 | 3/2009 | Patrick | |
| 2009/0066315 A1 | 3/2009 | Hu et al. | |
| 2009/0068849 A1 | 3/2009 | Endo et al. | |
| 2009/0109595 A1 | 4/2009 | Herchen et al. | |
| 2009/0197015 A1 | 8/2009 | Kudela et al. | |
| 2009/0200268 A1 | 8/2009 | Tappan et al. | |
| 2009/0200269 A1 | 8/2009 | Kadkhodayan et al. | |
| 2009/0218212 A1 | 9/2009 | Denpoh et al. | |
| 2009/0233384 A1 | 9/2009 | Foad et al. | |
| 2009/0242135 A1 | 10/2009 | Koshimizu et al. | |
| 2009/0250340 A1 | 10/2009 | Sasaki et al. | |
| 2009/0250443 A1 | 10/2009 | Kim | |
| 2009/0272492 A1 | 11/2009 | Katz et al. | |
| 2009/0275210 A1 | 11/2009 | Shanker et al. | |
| 2009/0277585 A1 | 11/2009 | Maebashi et al. | |
| 2009/0286333 A1 | 11/2009 | Kozasa et al. | |
| 2009/0286405 A1 | 11/2009 | Okesaku et al. | |
| 2009/0305509 A1 | 12/2009 | Stevenson et al. | |
| 2009/0321019 A1 | 12/2009 | Chen et al. | |
| 2009/0321249 A1 | 12/2009 | Chistyakov et al. | |
| 2010/0008016 A1 | 1/2010 | Onate et al. | |
| 2010/0024729 A1 | 2/2010 | Cao et al. | |
| 2010/0025371 A1 | 2/2010 | Cho et al. | |
| 2010/0065215 A1 | 3/2010 | Jeon et al. | |
| 2010/0072172 A1 | 3/2010 | Ui et al. | |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2011/0132874 A1 * | 6/2011 | Gottscho et al. | 216/67 |
| 2011/0135843 A1 | 6/2011 | Niira et al. | |
| 2011/0209663 A1 | 9/2011 | Endo et al. | |
| 2012/0142197 A1 | 6/2012 | Endo et al. | |
| 2013/0093443 A1 | 4/2013 | Patrick | |

FOREIGN PATENT DOCUMENTS

| | | |
|---|---|---|
| JP | 644481 | 6/1987 |
| JP | 5166595 | 7/1993 |
| JP | 5144594 | 11/1993 |
| JP | 794483 A | 7/1995 |
| JP | 878192 A | 7/1995 |
| JP | 7183282 A | 7/1995 |
| JP | 2001226775 | 8/2001 |
| JP | 2001237226 | 8/2001 |
| JP | 2004186532 A | 7/2004 |
| JP | 2004296729 A | 10/2004 |
| JP | 201034532 | 2/2010 |
| KR | 663668 B | 1/2007 |
| KR | 2007079870 A | 8/2007 |
| RU | 2022917 | 11/1994 |

(56) References Cited

FOREIGN PATENT DOCUMENTS

| RU | 2056702 | 3/1996 |
|---|---|---|
| RU | 2094961 | 10/1997 |
| WO | WO 01 36703 A1 | 5/2001 |
| WO | 2010013746 | 2/2010 |

OTHER PUBLICATIONS

PCT International Search Report—PCT/US2012/063987(dated Jan. 28, 2013) (3 pages).
PCT International Search Report—PCT/US2012/065080(dated Jan. 28, 2013) (2 pages).
PCT International Search Report—PCT/US2012/065684 (dated Jan. 28, 2013) (2 pages).
PCT International Search Report—PCT/US2012/65949(dated Feb. 5, 2013 (2 pages.
PCT International Search Report—PCT/US2012/065677(dated Feb. 7, 2013 (3 pages).
PCT International Search Report—PCT/US2012/66467(dated Feb. 8, 2013) (2 pages).
PCT International Search Report—PCT/US2012/65122—(dated Mar. 25, 2013) (2 pages).
PCT International Search Report—PCT/US2011/001175—dated Nov. 29, 2011 (2 pages).
PCT International Search Report—PCT/US2011/001174 dated Dec. 6, 2011 (2 pages).
PCT International Search Report—PCT/US2011/001176—dated Jan. 19, 2012 (4 pages).
Koretzky, E. Kuo, S.P.;Polytech, Univ., Farmingdale, NY, USA; Plasma Science, 1997 IEEE—Pub. Date May 19-22, 1997; on pp. 284.
Yamamoto, T. Ono, M. Takahashi, M. Ando, M. Goto, N.G. Yasaka, Y. Ishii, N.; Dept. of Electr. & Electron. Eng., Yamagata Univ. Yonezawa, Japan—Antennas and Propagation Society International Symposium, 2001, IEEE; Pub. Date: Jul. 8-13, 2001—vol. 3; pp. 712-715 vol. 3.
English translation of Notice of Reasons for Rejection issued in Japanese Patent Application No. 2012-555013, dated Jan. 6, 2015 (4 pages).

* cited by examiner

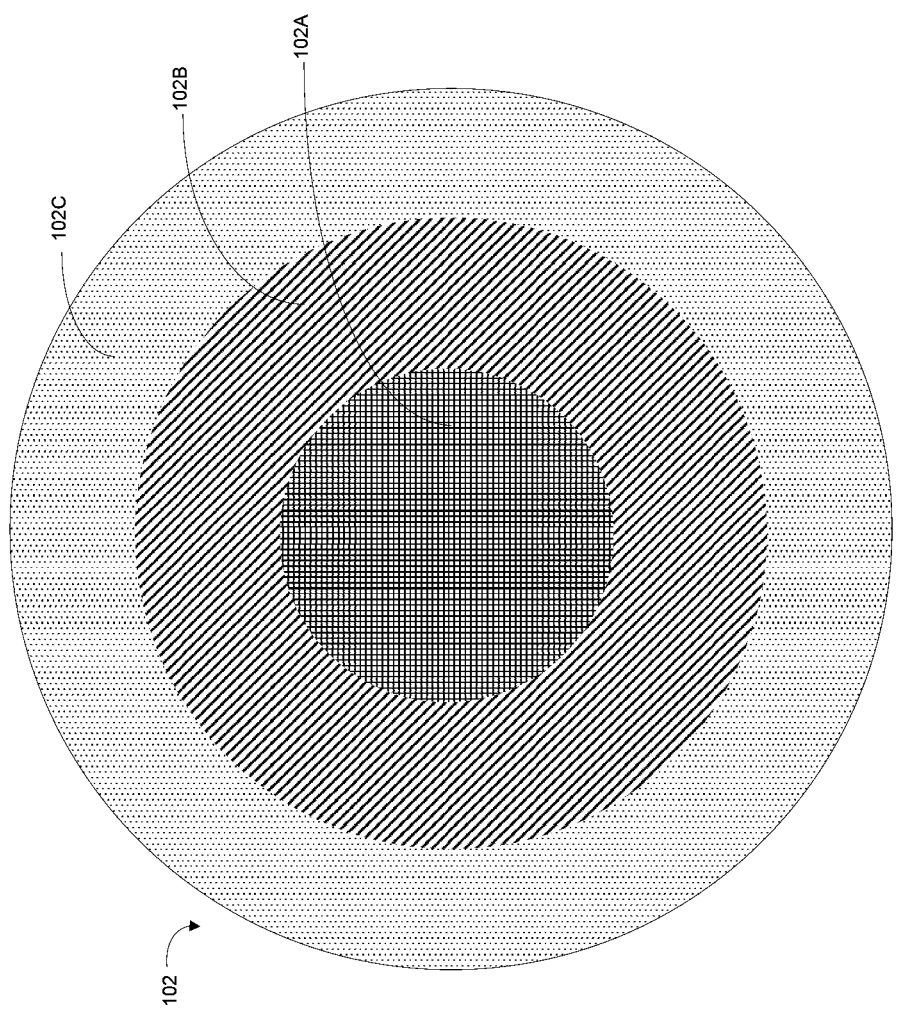

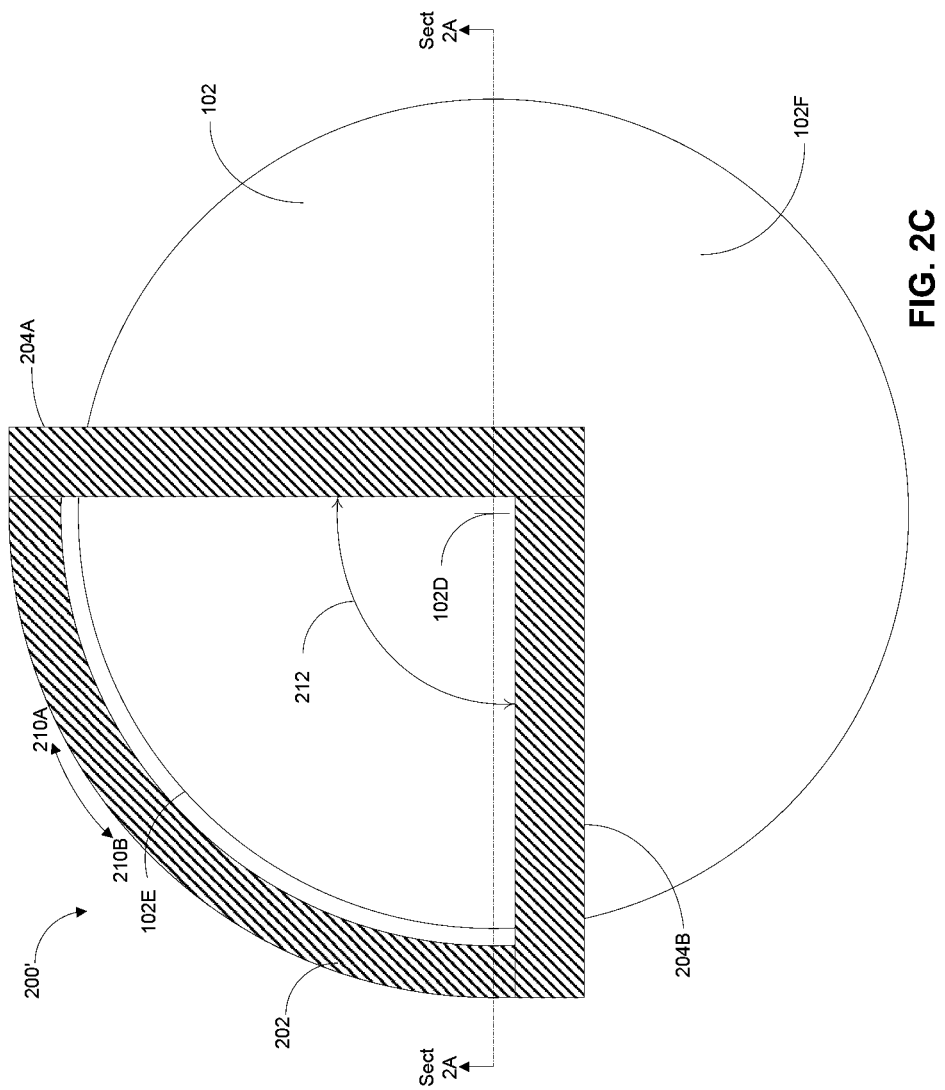

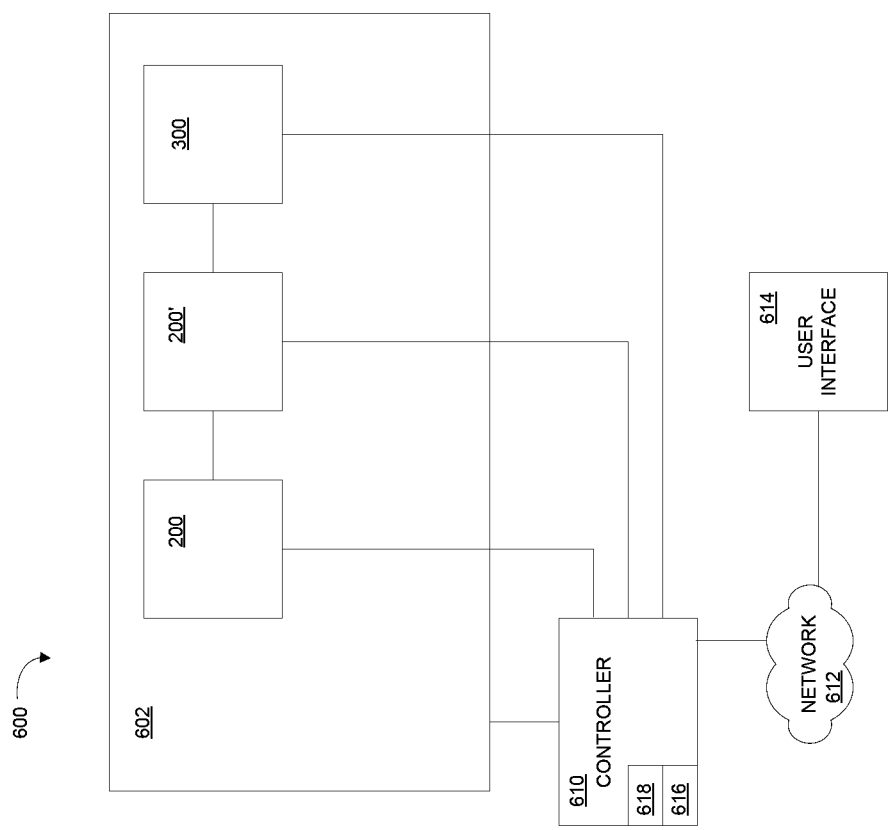

SYSTEM, METHOD AND APPARATUS OF A WEDGE-SHAPED PARALLEL PLATE PLASMA REACTOR FOR SUBSTRATE PROCESSING

CROSS REFERENCE TO RELATED APPLICATIONS

This application claims priority from U.S. Provisional Patent Application No. 61/560,292 filed on Nov. 15, 2011 and entitled "System, Method and Apparatus of a Wedge-Shaped Parallel Plate Plasma Reactor for Substrate," which is incorporated herein by reference in its entirety for all purposes.

BACKGROUND

The present invention relates generally to plasma reaction chambers, and more particularly, to methods, systems and apparatus for plasma reaction chambers having processing areas less than the total area of the surface being processed.

FIG. 1A is a side view of a typical parallel-plate, capacitive, plasma processing chamber 100. FIG. 1B is a top view of a substrate 102 processed in the typical parallel-plate, capacitive, plasma processing chamber 100. The typical plasma processes processing chamber 100 includes a top electrode 104, a bottom electrode 106 supporting a substrate to be processed 102. The top electrode 104 is typically a showerhead type electrode with multiple and inlet ports 109. The multiple inlet ports 109 allow process gases 110 in across the width of the processing chamber 100.

The typical parallel-plate, capacitive plasma reactor 100 is used for processing round planar substrates. Common processes are dielectric etch and other etch processes. Such plasma reactors typically suffer from inherent center-to-edge non-uniformities of neutral species.

The center-to-edge non-uniformities of neutral species arises from the differences in one or more of a flow velocity, an effective gas residence time, and gas chemical composition present at the center of the substrate as compared to the flow velocity, effective gas residence time, and gas chemical composition present at the edge. The gas chemical compositions can be influenced by composition and flow of injected gas mixtures; gas-phase dissociation, exchange and recombination reactions; as well as recombination products and byproducts from surface mediated etch.

By way of example, as the process gases are introduced across the width of the processing chamber the plasma 112 is formed between the top electrode 104 and bottom electrode 106. Plasma byproducts 118 are formed by reactions of plasma radicals and neutrals in the gas phase and/or with the surface of the substrate 102. The plasma byproducts 118 are transported to the sides of the substrate where they may exit the plasma and eventually are removed from the chamber by pumps 108. Plasma byproducts can include products from one or more dissociation reactions (e.g., $CF_4 + e^- \rightarrow CF_3 + F + e^-$) and/or one or more ionizations (e.g., $CF_4 + e^- \rightarrow CF_3^+ + F$) and/or one or more excitations (e.g., $Ar + e^- \rightarrow Ar^* + e^-$) and/or one or more attachments (e.g., $CF_4 + e^- \rightarrow CF_3 + F^-$) and/or one or more binary reactions (e.g., $CF_3 + H \rightarrow CF_2 + HF$).

Plasma byproducts 118 can also include substrate etch byproducts including $SiF_2$, $SiF_4$, CO, $CO_2$, and CN. Etch byproducts can also dissociate and react in the plasma 112 to form other species.

Recombination also occurs during the plasma processing. Recombination is a chemical reaction in which two neutral species combine to form a single molecule, the recombination product 120. Recombination typically occurs when the radicals and neutrals from the plasma 112 interact at surfaces such as the bottom surface of the top electrode 104. The recombination products 120 may be transported off the side of the substrate 102 into pumps 108, similar to the plasma byproducts 118. Plasma recombination products 120 can arise from one or more wall or surface binary reactions (e.g., $F + CF \rightarrow CF_2$, and/or $H + H \rightarrow H_2$, and/or $O + O \rightarrow O_2$, and/or $N + N \rightarrow N_2$). Plasma-surface interactions can also include deposition of films pm the wall or other internal surface of the chamber 100 e.g. CFx radicals may deposit a polymer film.

It should be noted that as shown in FIG. 1A, the plasma byproducts are lost from one side of the substrate 102 and the recombination products 120 are lost from the opposite side of the substrate 102 for clarity purposes only. In actual practice, those skilled in the art would realize that both the recombination products 120 and the plasma byproducts 118 are intermixed and lost from both sides of the substrate 102 to pumps 108.

During plasma processing the concentrations of the chemical species vary from the center to the edge of the substrate 102. These species include recombination products 120, the plasma byproducts 118, as well as unmodified injected gases. Due to these nonuniformities in chemical speciation, as well as other possible non-uniform conditions such as substrate surface temperature, ion flux, ion energy, etc., the effective plasma processing of the substrate, e.g. etching of a target film in a structure, varies from the center to the edge of the substrate 102.

By way of example, the plasma radical species could be most concentrated at the center of the substrate 102 in plasma processing regions 114A and 116A over central portion 102A of the substrate 102. Further, the radicals could be somewhat less concentrated in intermediate plasma processing regions one 114B and 116B over intermediate portion 102B of the substrate 102. Further still, the concentrations of the radicals could be even less concentrated in edge plasma processing regions 114C and 116C over the edge portion 102C of the substrate 102.

Thus, in this example, if the local radical density controls the plasma-induced etch rate, the highest etch rate would occur in the center plasma processing regions 114A and 116A over the center portion 102A of substrate 102 as compared to a slightly lower etch rate in the intermediate plasma processing regions 114B and 116B over the intermediate portion 102B of substrate 102 and even lower etch rate in the plasma processing of the edge plasma processing regions 114C and 116C over the edge portion 102C of the substrate. This would result in a center-to-edge nonuniformity of the substrate 102 film thickness after processing. Radial variations in etch and deposition rates are typical problems for commercial plasma processing systems, as applied to round flat substrates such as wafers.

This center-to-edge nonuniformity is exacerbated in small volume product plasma processing chambers that have a very large aspect ratio. For example, a very large aspect ratio is defined as when the width W of the substrate is about four or more or more times the height H of the plasma processing region. The very large aspect ratio of the plasma processing region limits the effectiveness of gas-phase diffusion for mixing neutral species, and thus tends to worsen the non-uniformity of the plasma byproducts 118 and recombination products 120 in the plasma processing regions 114A-116C.

Although this center-to-edge non-uniformity of neutral species is not the only cause of center-to-edge process non-uniformity, in many dielectric etch applications it is a significant contributor. Specifically, neutral-sensitive processes such as gate or bitline mask open, photoresist (PR) strip over low-k films, highly selective contact/cell, and dual-damascene (DD) via etch may be especially sensitive to these effects. Similar problems may apply in other parallel-plate plasma reactors, besides those used for wafer dielectric etch.

In view of the foregoing, there is a need for improving the center-to-edge chemical species uniformity in plasma etch processes.

SUMMARY

Broadly speaking, the present invention fills these needs by providing an improved parallel plate plasma processing chamber. It should be appreciated that the present invention can be implemented in numerous ways, including as a process, an apparatus, a system, computer readable media, or a device. Several inventive embodiments of the present invention are described below.

One embodiment provides a plasma process chamber including a top electrode, a bottom electrode disposed opposite the top electrode, and a bottom electrode capable of supporting a substrate. The plasma process chamber also includes a plasma containment structure defining a plasma containment region over the substrate, with the area defined by plasma containment region being less than an entire surface of the substrate. The plasma containment structure rotates relative to the substrate and wherein the plasma containment region includes a center point of the substrate throughout the rotation of the plasma containment structure relative to the substrate. The plasma containment structure includes multiple gaps. A pumped vacuum region is coupled to the gaps in the plasma containment structure.

The plasma containment structure can include a containment ring and an inner containment. The top electrode can be coupled to a top electrode bias potential and the bottom electrode can be coupled to bottom electrode bias potential. The gaps in the plasma containment structure determine a greater first pressure of one or more process gas in the plasma containment region and a lesser second pressure of a remaining portion of the process chamber outside the plasma containment region. The first pressure can be at least twice the second pressure.

The top electrode can be coupled to at least one process gas source and the top electrode includes multiple inlet ports. A first portion of the inlet ports are open and a second portion of the inlet ports are closed, the first portion being disposed within the plasma containment region and the second portion being disposed within a remaining portion of the process chamber outside the plasma containment region.

The containment structure can include a containment angle of between about 30 degrees and about 330 degrees. A first portion of the gaps in the plasma containment structure are formed between the plasma containment structure and the lower electrode. A second portion of the gaps in the plasma containment structure are formed in the plasma containment structure.

The plasma containment structure can include an inner containment extension, the inner containment extension extending from the plasma containment structure between the top electrode and the bottom electrode into a remaining portion of the process chamber outside the plasma containment region. The plasma process chamber can be included in an integrated system including an integrated system controller coupled to the plasma process chamber, the integrated system controller including a user interface, logic for monitoring and controlling the plasma process chamber and logic for collecting, storing, displaying, and analyzing data from the plasma process chamber.

Another embodiment provides a plasma process chamber including a top electrode, a bottom electrode disposed opposite the top electrode, the bottom electrode capable of supporting a substrate. The plasma process chamber also including a plasma containment structure defining a plasma containment region, the plasma containment region being less than an entire surface of the substrate, wherein the plasma containment structure rotates relative to the substrate an wherein the plasma containment region includes a center point of the substrate throughout the rotation of the plasma containment structure relative to the substrate, wherein plasma containment structure include a containment ring and an inner containment, wherein the containment structure includes a containment angle of between about 30 degrees and about 330 degrees. The plasma process chamber also includes multiple gaps in the plasma containment structure, wherein the gaps in the plasma containment structure determine a greater first pressure of one or more process gas in the plasma containment region and a lesser second pressure of a remaining portion of the process chamber outside the plasma containment region. A vacuum source can be coupled to the gaps in the plasma containment structure.

Yet another embodiment provides a method of processing a substrate including loading a substrate in a processing chamber, wherein the substrate is supported on a bottom electrode and wherein the processing chamber includes a top electrode opposing the bottom electrode. The method of processing the substrate also including placing a plasma containment structure over a selected portion of the surface of the substrate to define a plasma containment region of the selected portion of the surface of the substrate and injecting at least one process gas into the plasma containment region. The top electrode and the bottom electrode as biased. Process byproducts are exhausted from the plasma containment region. The plasma containment region is moved relative to the substrate to selectively eventually pass over the entire surface of the substrate.

A first pressure of the least one process gas in the plasma containment region is at least twice a second pressure of a remaining portion of the process chamber outside the plasma containment region. The plasma containment structure can include an inner containment extension, the inner containment extension extending from the plasma containment structure between the top electrode and the bottom electrode into a remaining portion of the process chamber outside the plasma containment region.

The containment structure can include a containment angle of between about 30 degrees and about 330 degrees. The top electrode can be coupled to at least one process gas source and the top electrode can include multiple inlet ports, wherein a first portion of the inlet ports are open and a second portion of the inlet ports are closed, the first portion being disposed within the plasma containment region and the second portion being disposed within a remaining portion of the process chamber outside the plasma containment region.

At least one of the top electrode bias potential and the bottom electrode bias potential can be applied to the respective top electrode and bottom electrode.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 1B is a top view of a substrate processed in the typical parallel-plate, capacitive, plasma processing chamber.

FIG. 2C is a top view of a plasma processing chamber with the top electrode not shown, in accordance with an embodiment of the present invention.

FIG. 6 is a block diagram of an integrated system including one or more of the plasma processing chambers, in accordance with an embodiment of the present invention.

DETAILED DESCRIPTION

Figure 1A:
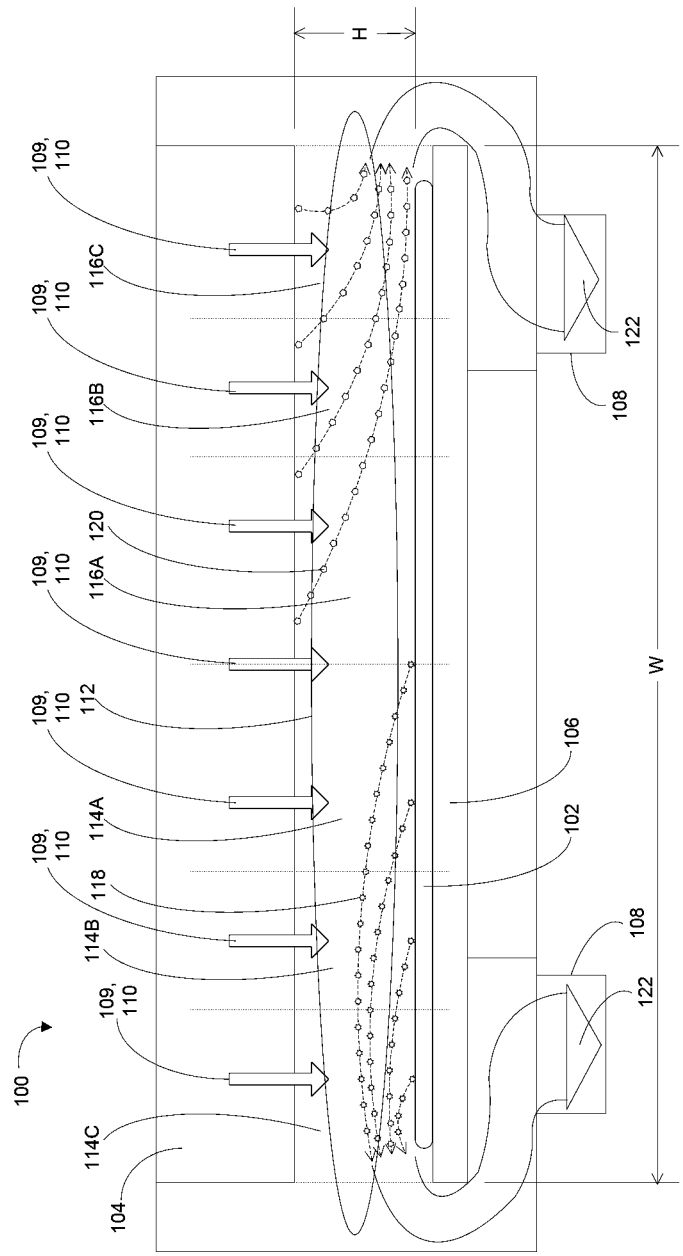
FIG. 1A is a side view of a typical parallel-plate, capacitive, plasma processing chamber.

Several exemplary embodiments for an improved parallel plate plasma processing chamber will now be described. It will be apparent to those skilled in the art that the present invention may be practiced without some or all of the specific details set forth herein.

The invention reduces center-to-edge differences in the neutral species densities by separating the circular symmetry traditionally used in parallel-plate wafer etching. In one wedge-shaped region of the reactor, the wafer is processed by a plasma, for example a capacitive discharge plasma. This wedge is called the plasma containment region. In the complementary wedge or portion of the processing chamber outside the containment region, there is little or no plasma present, such that the extent of substrate processing in this "non-etch" region is minimal compared to the containment region. The portion of the processing chamber outside the plasma containment region provides an efficient gas conductance path for effluent. Because this region is arranged to always be close to the center region of the substrate, the effective pumping of gases from the center is increased relative to the traditional circular-plasma arrangement. The center region of the substrate, within the plasma containment region but near the tip of containment region, is pumped nearly as efficiently as the region near the edge of the substrate within the plasma confinement region. This enhanced center region gas removal substantially balances the inherent non-uniformity of the center pumping in the conventional parallel-plate geometry for round planar substrates. The substrate and/or the wedge-based upper hardware would be rotated to ensure all areas of the substrate are exposed to plasma for substantially equal times in the course of one cycle, thus providing azimuthally uniform process results, when averaged over multiple rotations.

The etch region can have a plasma containment region (i.e., wedge) encompassing more than about 270 degrees of a circle. This ensures reasonably high processing rates compared to prior art. The complementary non-etch region in the portion of the processing chamber outside the plasma containment region would include plasma confinement along both radial boundaries, to exclude plasma from the non-etch region.

Gas transport from the plasma containment region to the non-etch region is provided around and through the confinement structure. The plasma confinement structure allows significant gas conductance while excluding the plasma as will be described in more detail below. Gas removal near the center of the substrate (e.g., a tip of the non-etch wedge), relative to the edge, can be enhanced by including a pump-out port in the upper surface near the tip of the non-etch wedge, leading to a vacuum pump.

Radial and azimuthal variations in the gap between substrate and top surface can be used to tune the gas conductance versus radius, to deliver an optimal neutral uniformity in the containment region. The containment structure can also provide a pressure differential between the pressure inside the containment structure and a pressure external to the containment region. This pressure differential helps to maintain a no-plasma condition in the non-etch region while a plasma sustaining condition exists in the containment region.

RF bias power can be applied to the substrate and the top electrode can be grounded in the containment region. The local conditions of the containment region, including gap, pressure, surface temperatures, and plasma density would be targeted to be similar to typical prior art parallel-plate plasma reactors.

A more uniform neutral speciation center-to-edge is produced as compared to conventional parallel-plate wafer processing or any known variations. Traditionally one method for improving center-to-edge neutral uniformity is to increase the reactor gap. But this doesn't eliminate the problem, it just smoothes the variations out by diffusion, with the usually negative tradeoffs of lower plasma density, longer gas residence time, and variations in plasma uniformity.

Although other configurations may be imagined where the substrate moves relative to the upper electrode of the process chamber, in the present invention every point on the substrate is exposed to plasma for a substantially equal amount of time. This is inherent in the wedge shape and the rotation of the substrate and/or the containment structure.

The present invention is superior to line-shaped plasma sources, with linear motion perpendicular to the line, because it avoids possible plasma loading non-uniformities as the width of the processed region varies while the substrate scans across the plasma line. The present invention is superior to typical parallel-plate substrate processing schemes that would add pumping ports in the top plate, because that approach leads to the inherent plasma and neutral non-uniformities near the pump ports, and requires the confinement of plasma close to the pump ports. The present approach avoids these problems, such that the plasma containment region of the process chamber has a substantially uniform plasma and neutral environment, free from local hardware effects in the top end. Also the present invention separates the plasma confinement from optional pump-out ports in the top hardware, simplifying the engineering of both functions.

Figure 2A:
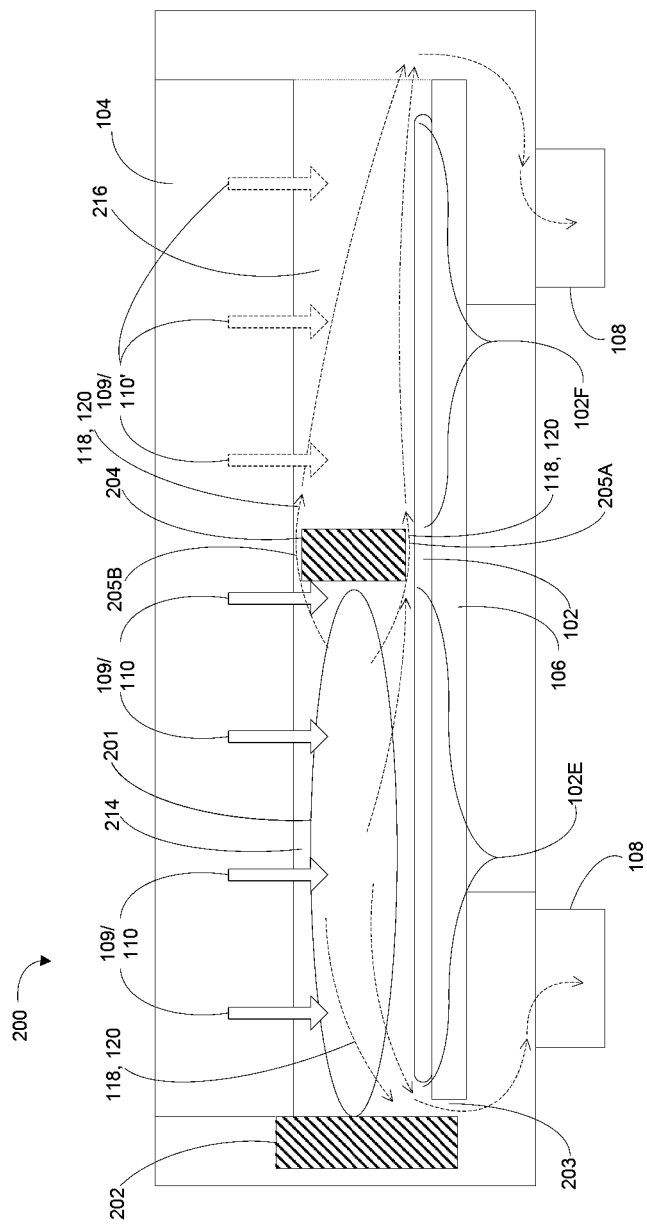
FIG. 2A is a side sectional view of a plasma processing chamber, in accordance with an embodiment of the present invention.

FIG. 2A is a side sectional view of a plasma processing chamber 200, in accordance with an embodiment of the present invention. The plasma processing chamber 200 includes containment structure. The containment structure includes an edge containment ring 202 and an inner containment 204. The edge containment ring 202 and inner containment 204 constrain the plasma 201 over a selected portion 102E of the surface of the substrate 102. The edge containment ring 202 and inner containment 204 can be formed from any suitable dielectric materials and combinations thereof (e.g., ceramic, silicon dioxide, quartz, etc.)

The containment ring 202 is substantially close to the edge of the substrate 102 and leaves only a relatively small gap 203 between the edge of the substrate and the containment ring. The gap 203 is between about 0.2 mm and about 4 mm. Thus the plasma byproducts 118 and recombination byproducts 120 can escape the plasma processing region via the relatively small gap 203 to the pumps 108.

The plasma 201 is constrained between the inner containment 204 and the edge containment ring 202. The inner containment 204 prevents the plasma 201 from being formed over the remaining surface area 102F of the substrate 102. The inner containment 204 provides at least one gap 205A, 205B, between the inner containment and the top electrode 104 and between the inner containment and the surface of the substrate 102. The gap(s) 205A, 205B are between about 0.3 mm and about 6 mm. Thus the plasma byproducts 118 and recombination byproducts 120 can escape the plasma processing region via the relatively small gaps 205A, 205B and then through a high-conductance path 216 to the pumps 108.

The containment ring 202 is and the inner containment 204 also concentrate the process gases 110 and thus determine the location where the plasma 201 can be supported. A minimum concentration and/or pressure of process gases 110 are needed before a plasma 201 can be supported between the top electrode 104 and the bottom electrode 106. The pressure in the plasma containment region 214 is approximately at least twice the pressure as remaining portion 216 of the process chamber 200 outside the containment region.

A combination of the flow rate of the process gases into the plasma containment region 214 and the relatively small gaps 203, 205A, 205B maintains the pressure differential between the plasma containment region and the remainder of the process chamber 200. As a result of the pressure differential, the plasma 201 can only be supported within the plasma containment region 214. Therefore, there will be no plasma present in the portion 216 of the process chamber 200 outside the plasma containment region 214 because the process gases 110 are not concentrated sufficiently to support a plasma outside the containment region.

The plasma 201 can also be constrained to the plasma containment region 214 because the process gases 110' are substantially stopped from flowing into the portion 216 of the process chamber 200 outside the plasma containment region 214. Thus there is an insufficient concentration of the process gases in the portion 216 of the process chamber 200 outside the plasma containment region 214. The top electrode can include a one or more valves and/or manifold system (not shown) to control or stop the flow of process gases 110' the portion 216 of the process chamber 200 outside the plasma containment region 214.

The plasma 201 can also be constrained to the plasma containment region 214 because one or both of the top electrode 104 and bottom electrode 106 can be selectively biased. By way of example only that portion of the top electrode 104 included within the plasma containment region 214 might be biased and the remaining portion of the top electrode 104 that is not included within the plasma containment region remains unbiased or biased in a different manner to prevent formation of plasma outside the containment region. Similarly, the only that portion of the bottom electrode 106 included within the plasma containment region 214 might be biased and the remaining portion of the bottom electrode 106 that is not included within the plasma containment region remains unbiased or biased in a different manner to prevent formation of plasma outside the containment region.

Figure 2B:
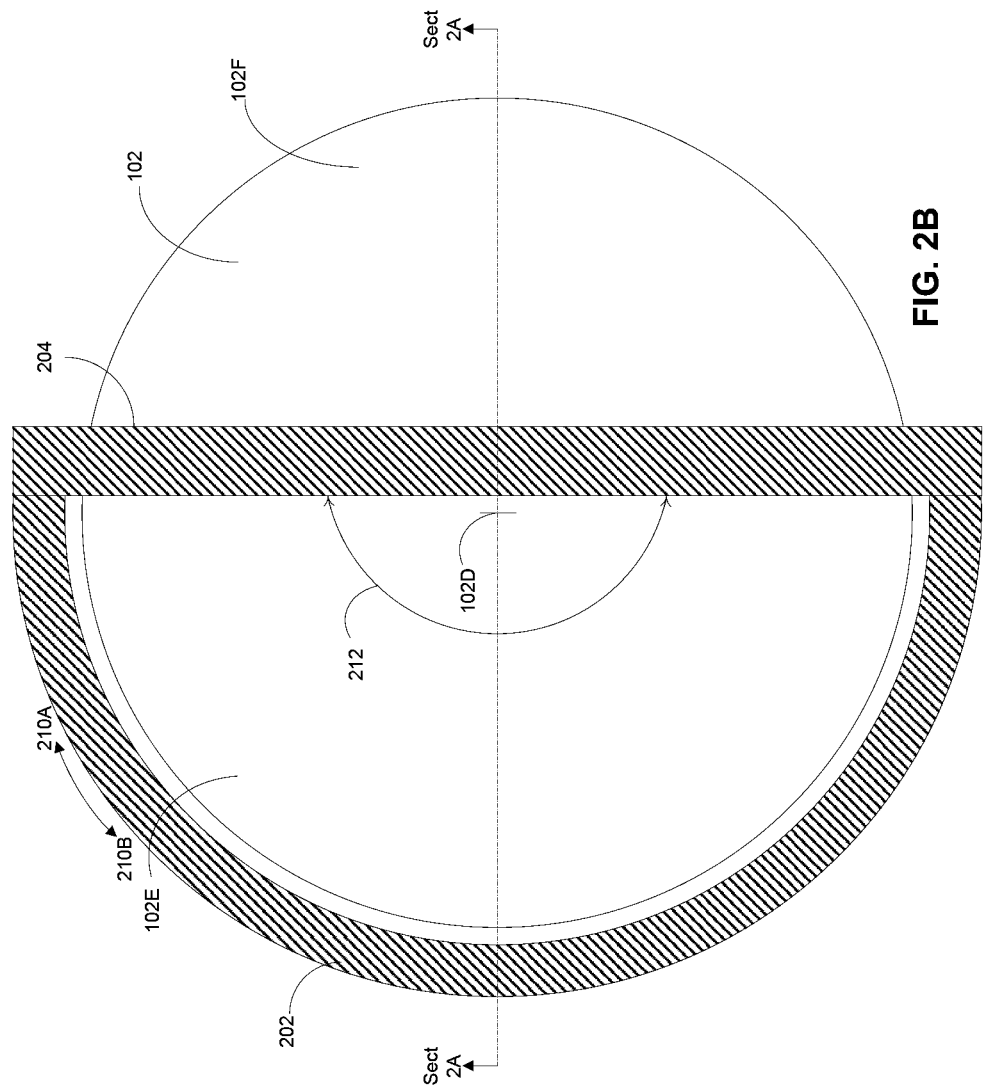
FIG. 2B is a top view of a plasma processing chamber with the top electrode not shown, in accordance with an embodiment of the present invention.

FIG. 2B is a top view of a plasma processing chamber 200 with the top electrode 104 not shown, in accordance with an embodiment of the present invention. As shown in FIG. 2B, the plasma processing chamber 200 has a containment ring 202 and inner containment 204 containing a plasma processing region over a containment angle 212 of about 180 degrees. The containment angle 212 of about 180 degrees selects a portion 102E of slightly more than one half of the substrate 102 surface.

The plasma containment ring 202 and inner containment 204 can move relative to the surface of the substrate 102. By way of example, the plasma containment in ring 202 and inner containment 204 can rotate relative to the surface of the substrate 102 in one or both directions 210A, 210B. Alternatively, the substrate 102 can rotate relative to the plasma containment ring 202 and inner containment 204. Alternatively, both the substrate 102 and the plasma containment in ring 202 and inner containment 204 can rotate relative to one another.

Moving the inner containment 204 over the surface of the substrate 102 allows plasma processing of the entire surface of the substrate 102 in the course of a complete cycle of motion. It should be noted that the center 102D of the substrate 102 is maintained within the plasma processing region as the plasma containment ring 202 and inner containment 204 are moved relative to the surface of the substrate 102.

Figure 2D:
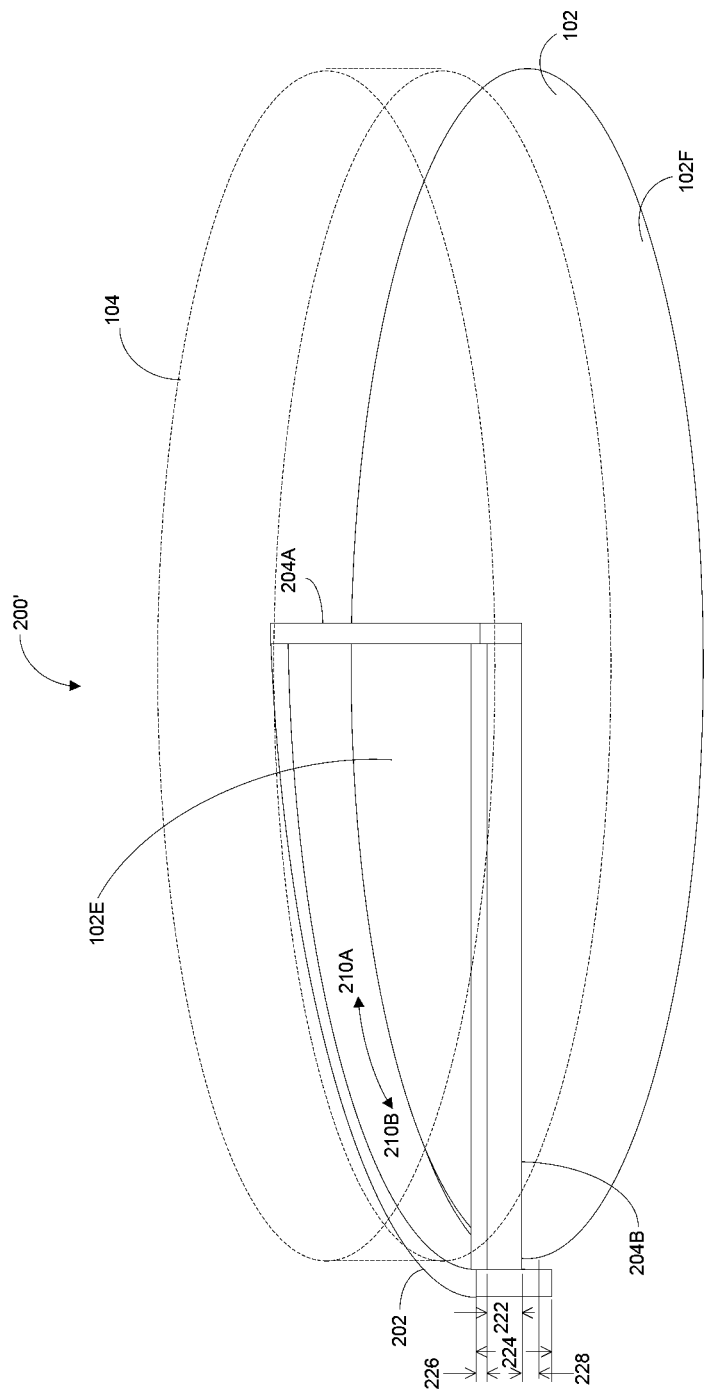
FIG. 2D is a perspective view of a plasma processing chamber, in accordance with an embodiment of the present invention.

FIG. 2C is a top view of a plasma processing chamber 200' with the top electrode 104 not shown, in accordance with an embodiment of the present invention. FIG. 2D is a perspective view of a plasma processing chamber 200', in accordance with an embodiment of the present invention. As shown in FIGS. 2C and 2D, the plasma processing chamber 200 has a containment ring 202 and inner containment 204 containing a plasma processing region over a containment angle 212 of about 90 degrees.

Figure 2E:
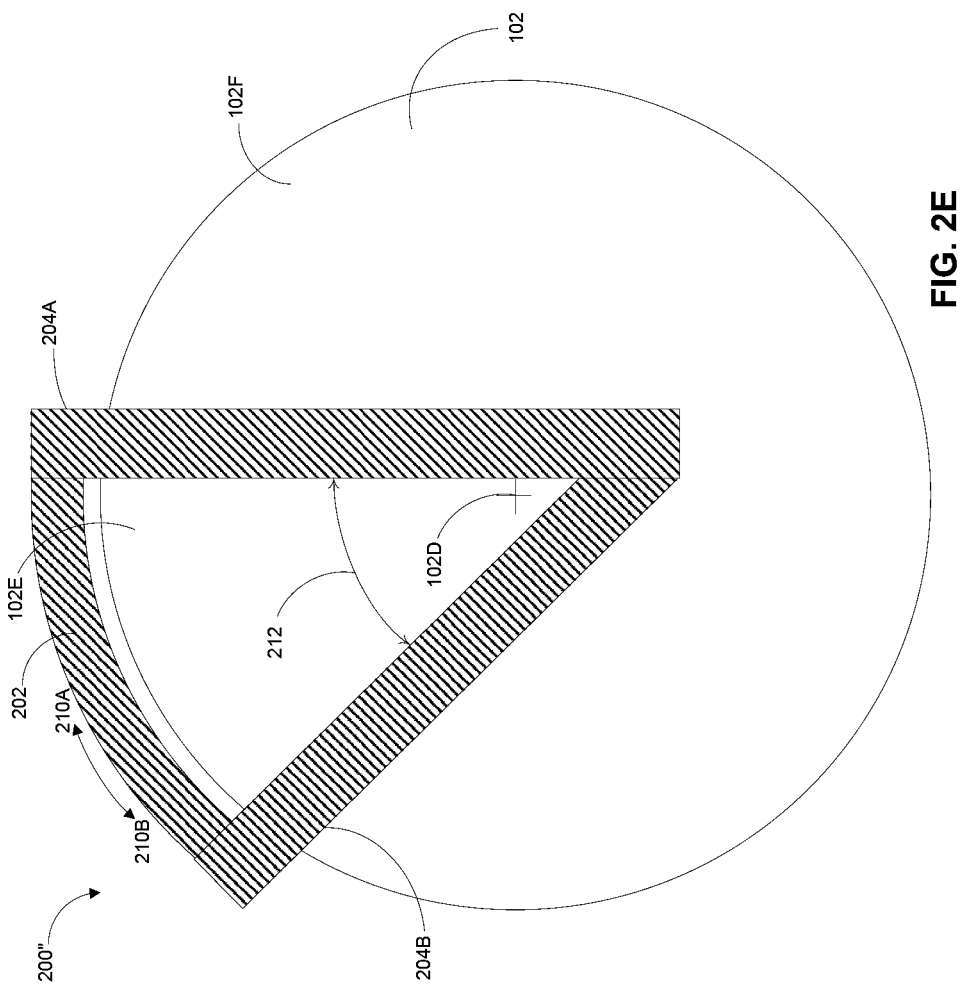
FIG. 2E is a top view of a plasma processing chamber with the top electrode not shown, in accordance with an embodiment of the present invention.

FIG. 2E is a top view of a plasma processing chamber 200" with the top electrode 104 not shown, in accordance with an embodiment of the present invention. Plasma processing chamber 200" has a containment ring 202 and inner containment 204 containing a plasma processing region over a containment angle 212 of less than about 90 degrees, e.g., between less than about 30 degrees and about 90 degrees.

Figure 2F:
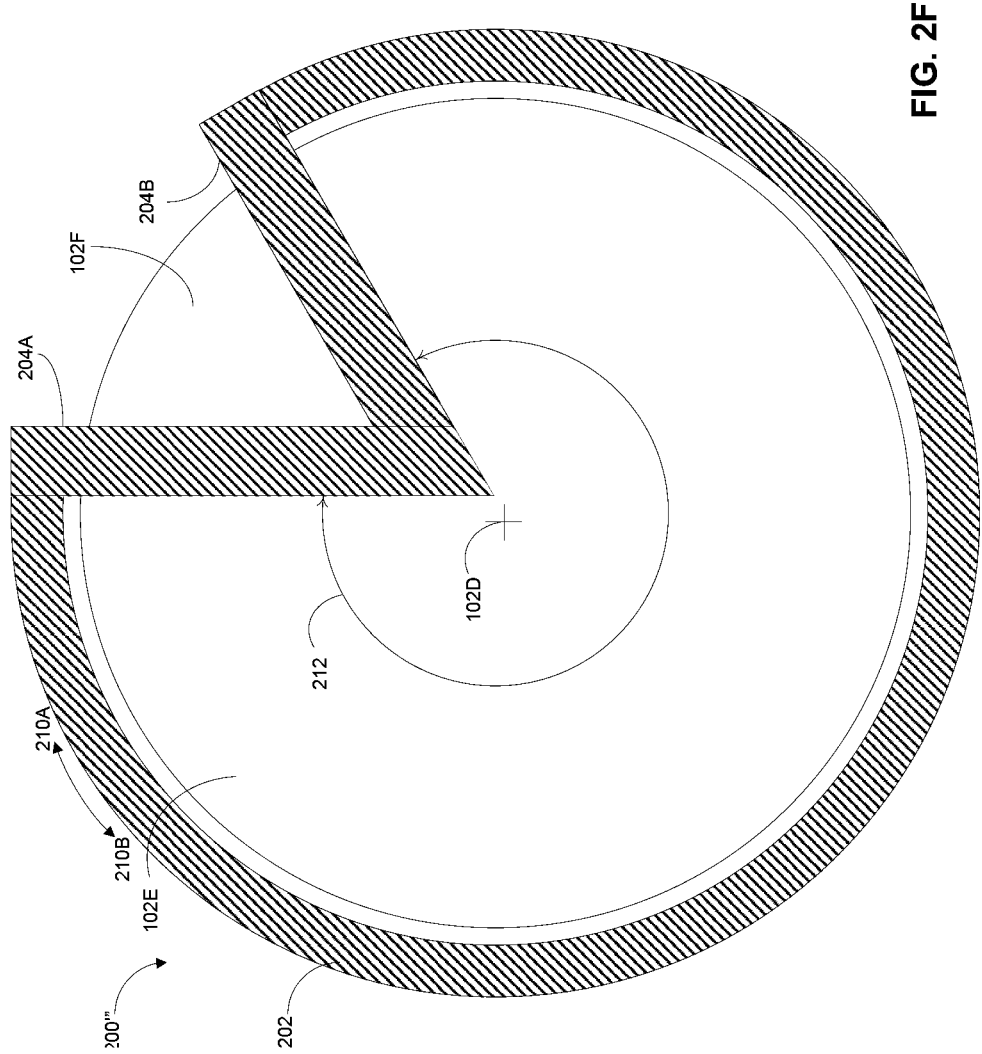
FIG. 2F is a top view of a plasma processing chamber with the top electrode not shown, in accordance with an embodiment of the present invention.

FIG. 2F is a top view of a plasma processing chamber 200''' with the top electrode 104 not shown, in accordance with an embodiment of the present invention. Plasma processing chamber 200''' has a containment ring 202 and inner containment 204 containing a plasma processing region over an angle 212 of greater than about 180 degrees and less than 360 degrees, e.g., between about 180 and more than about 330 degrees. As shown in various embodiments, the containment angle 212 can be between less than about 30 degrees and more than about 330 degrees.

Figure 2G:
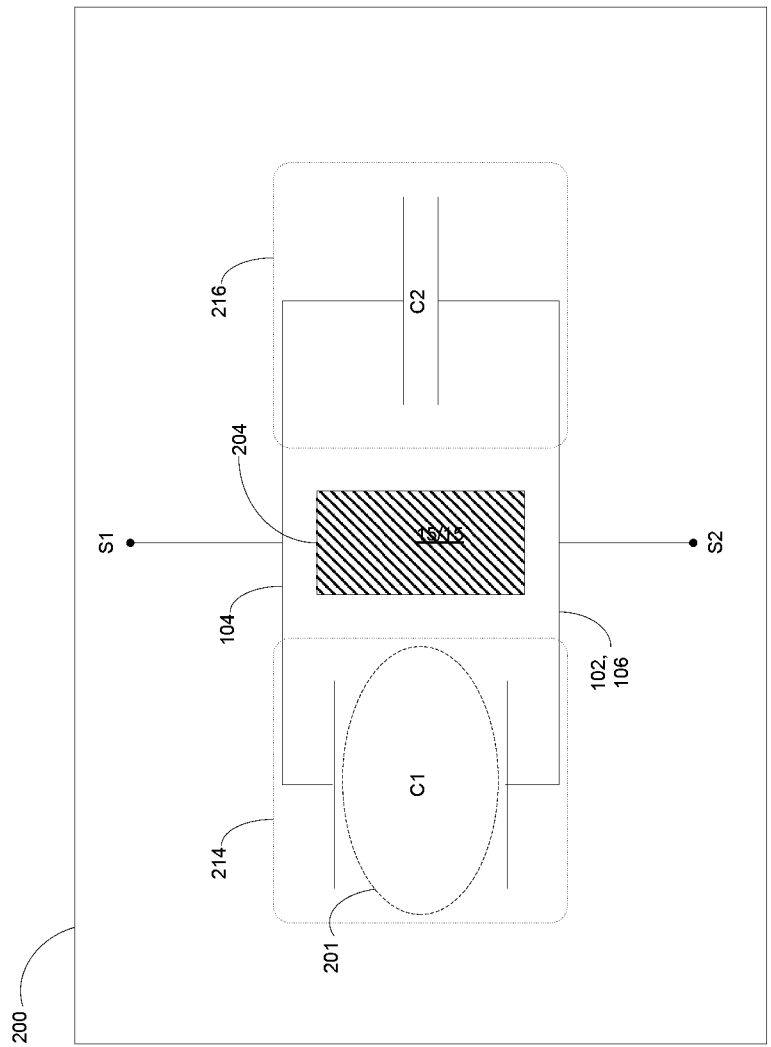
FIG. 2G is electrical schematic of a processing chamber, in accordance with an embodiment of the present invention.

FIG. 2G is electrical schematic of a processing chamber 200, in accordance with an embodiment of the present invention. S1 is a bias signal applied to the top electrode 104. S2 is a bias signal applied to the bottom electrode 106. Capacitor C1 represents the effective capacitance of the plasma 201, which may behave similar to a capacitive load for typical conditions. Capacitor C2 represents the capacitance between the top electrode 104 and the bottom electrode 106 outside the plasma 201 plasma containment region 214. The capacitor C1 and capacitor C2 are separated by the inner containment 204. The capacitance C1 of the plasma 201 is much greater than the capacitance of capacitor C2, because capacitance C2 is mainly determined by the chamber gap which capacitance C1 is mainly determined by the top and bottom plasma sheaths, in series, both with much small widths than the chamber gap. As a result, the impedance of capacitor C1 is less than the impedance of capacitor C2. Therefore, the bulk of the current flow between the top electrode 104 and the bottom electrode 106 is through the plasma 201 in the plasma containment region 214. This ensures efficient use of supplied current.

Figure 3A:
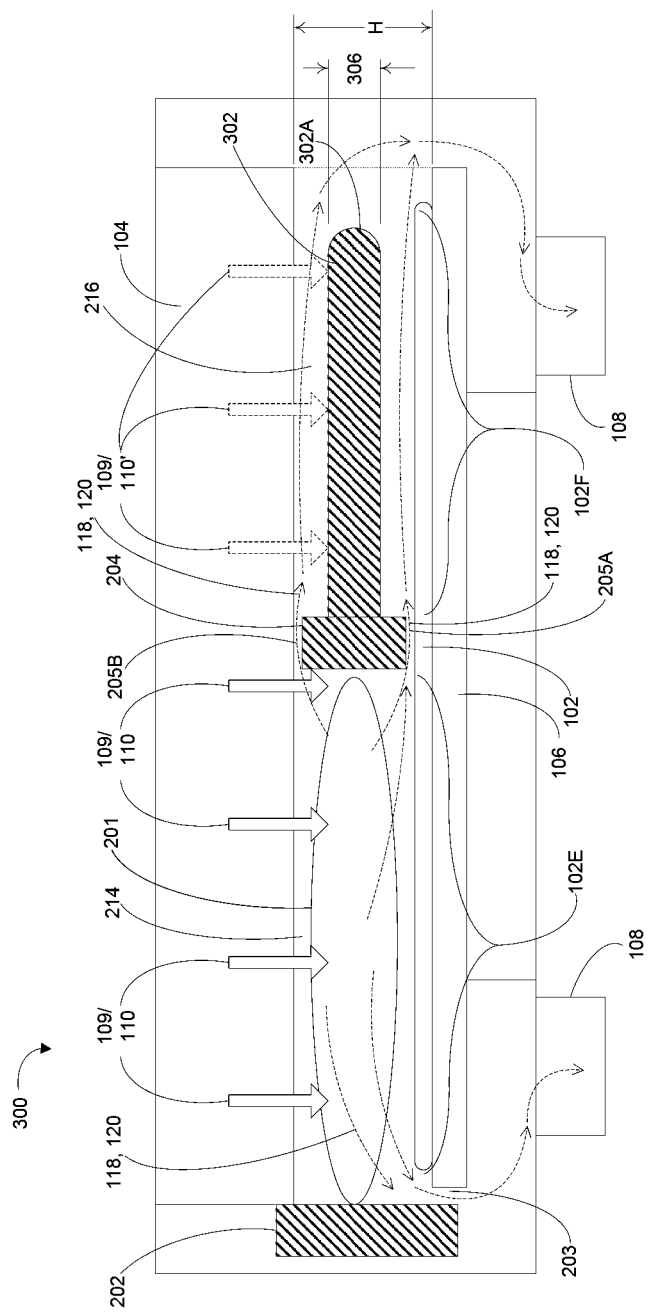
FIG. 3A is a side sectional view of a plasma processing chamber, in accordance with an embodiment of the present invention.
Figure 3B:
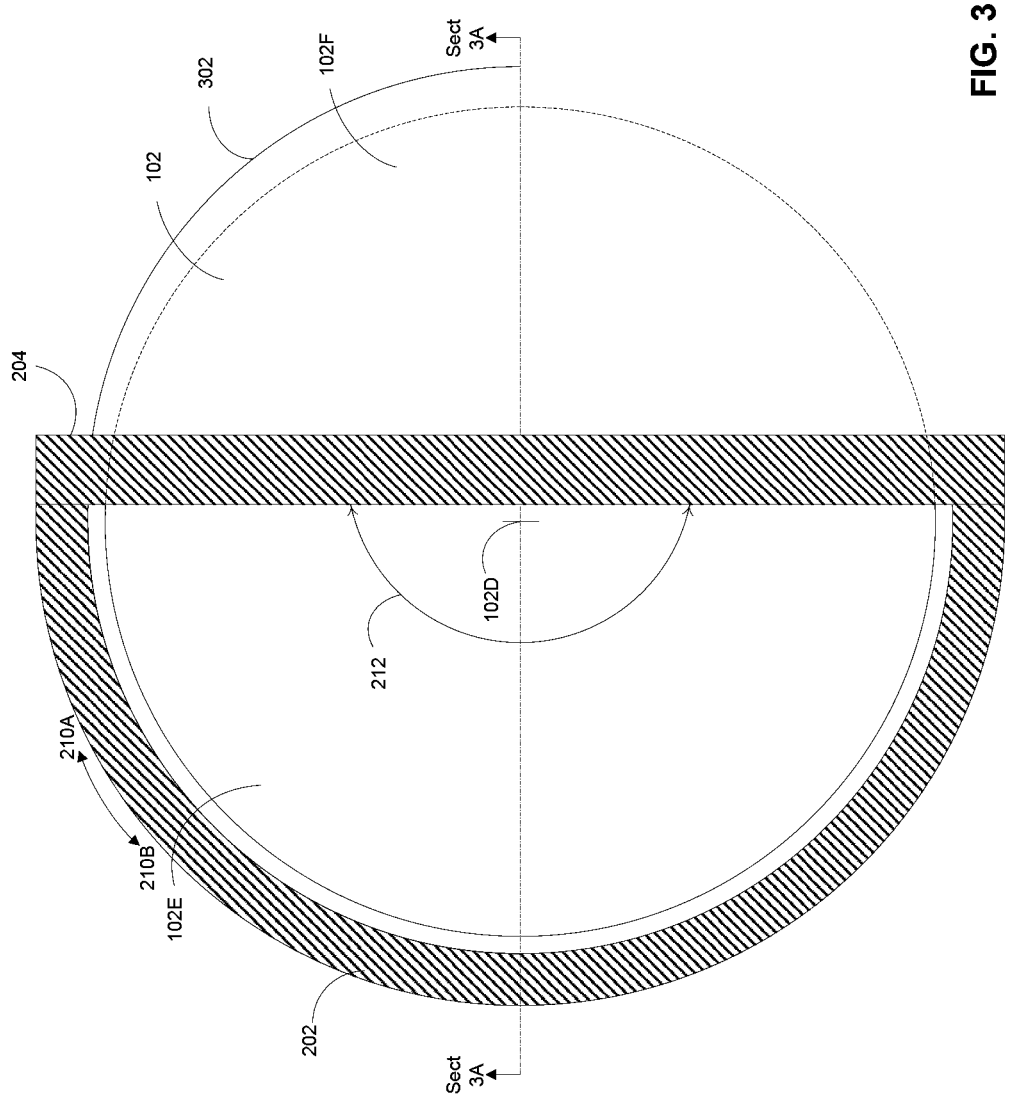
FIG. 3B is a top view of a plasma processing chamber, with the top electrode not shown, in accordance with an embodiment of the present invention.
Figure 3C:
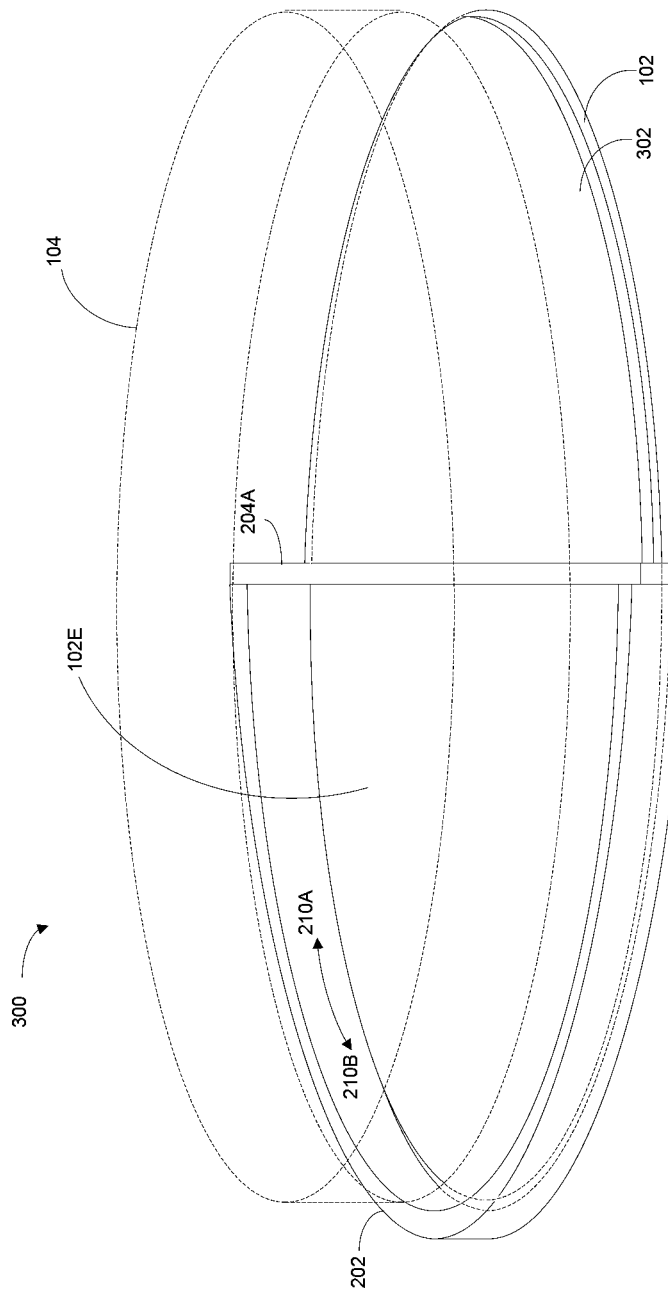
FIG. 3C is a perspective view of the plasma processing chamber, in accordance with an embodiment of the present invention.

FIG. 3A is a side sectional view of a plasma processing chamber 300, in accordance with an embodiment of the present invention. FIG. 3B is a top view of a plasma processing chamber 300, with the top electrode 104 not shown, in accordance with an embodiment of the present invention. FIG. 3C is a perspective view of the plasma processing chamber 300, in accordance with an embodiment of the present invention. The plasma processing chamber 300 includes an edge containment ring 202 and an inner containment 204. The edge containment ring 202 and inner containment 204 constrain the plasma 201 over a selected portion 102E of the surface of the substrate 102. The inner containment 204 also includes an inner containment extension 302.

The inner containment extension 302 substantially extends over the remaining portion of the substrate 102 external from the plasma containment region 214. The inner containment extension 302 further prevents the formation of a plasma over the remainder of the substrate 102. The inner containment extension 302 can have an enhanced-conductance shape such as rounded end 302A as shown or other tapered, curved, grooved, and/or tailored shapes as may be applied to improve the flow of gases 118, 120 from the plasma containment region 214. The inner containment extension 302 can have a thickness 306 in whatever thickness necessary to prevent the formation of the plasma. By way of example, the inner containment extension 302 can have a thickness 306 of between 20% and about 80% of the chamber gap (height H of the plasma processing region).

Figure 4:
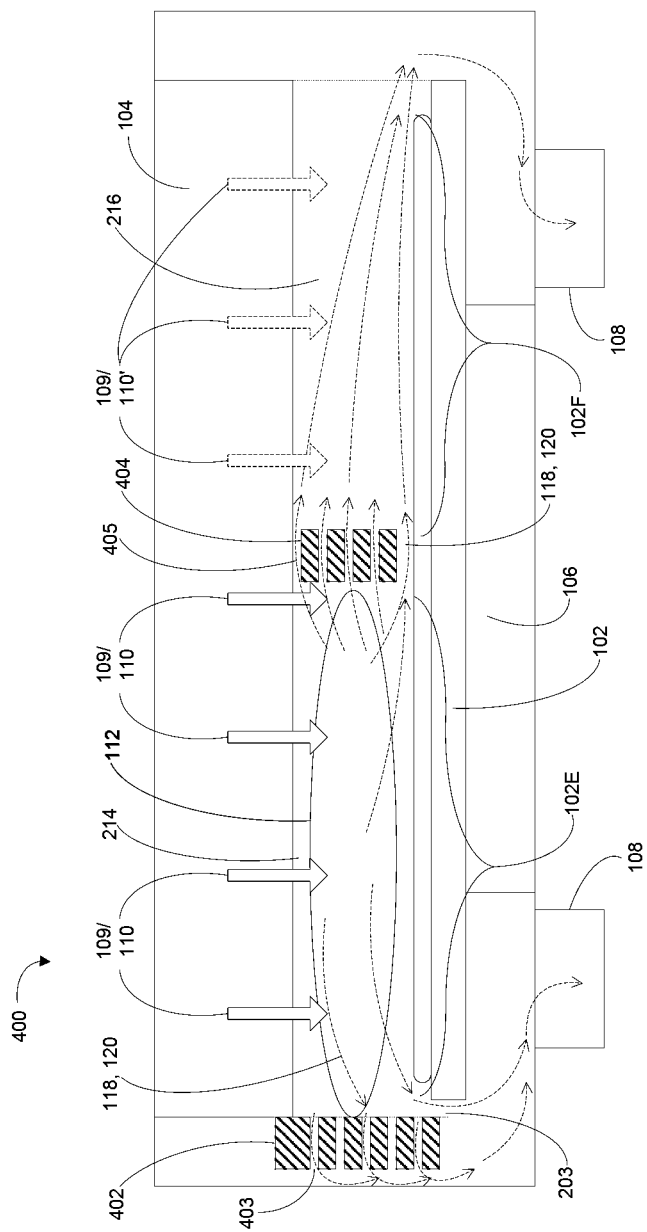
FIG. 4 is a side sectional view of a plasma processing chamber, in accordance with an embodiment of the present invention.

FIG. 4 is a side sectional view of a plasma processing chamber 400, in accordance with an embodiment of the present invention. The plasma processing chamber 400 includes an edge containment ring 402 and an inner containment 404. As described above, with regard to the edge containment ring 202 and inner containment 204, edge containment ring 402 and an inner containment 404 constrain the plasma 201 in the plasma containment region 214 over a selected portion 102E of the surface of the substrate 102.

The inner containment 404 can be formed in multiple layers of thinner containment elements. Gaps 405 of a desired size and number can be selectively formed between the elements of the inner containment 404 by installing the desired spacers (not shown) between the elements of the inner containment 404.

Similarly, the edge containment ring 402 can be formed in multiple layers of thinner containment elements. Gaps 403 of a desired size and number can be selectively formed between the elements of the containment ring 402 by installing the desired spacers (not shown) between the elements of the edge containment ring 402. By way of example, the gaps 403, 405 can be between about 0.2 mm and about 3 mm.

The plasma byproducts 118 and recombination products 120 can pass from the plasma containment region 214 through the gaps 403, 405 to the pumps 108. The sizes and numbers of gaps 403, 405 can be selected to control the pressure differential between the plasma containment region 214 and the remaining portion of the processing chamber 400. There may be between one and 6 gaps 403, 405 in the respective containment ring 402 and inner containment 404. There may be a greater or lesser number of gaps in the containment ring 402 than in the inner containment 404. The gaps 403 in the containment ring 402 may be aligned with or offset from the gaps 405 in the inner containment 404. Each of the gaps 403, 405 in the respective containment ring 402 and inner containment 404 can be the same of different sizes.

Figure 5:
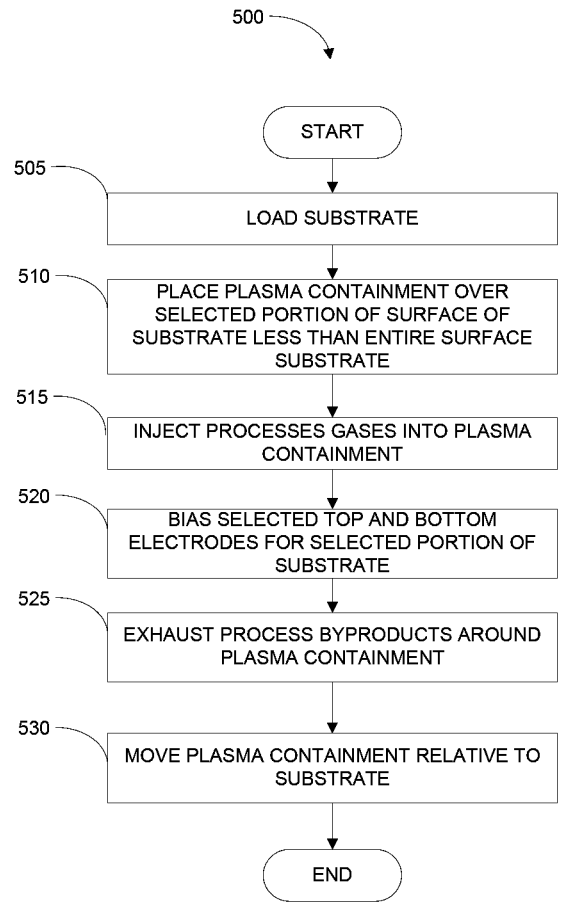
FIG. 5 is a flowchart of the method operations of a plasma processing chamber, in accordance with an embodiment of the present invention.

FIG. 5 is a flowchart of the method operations of a plasma processing chamber 200, 200', 200", 200''', 300, 400, in accordance with an embodiment of the present invention. The operations illustrated herein are by way of example, as it should be understood that some operations may have sub-operations and in other instances, certain operations described herein may not be included in the illustrated operations. With this in mind, the method and operations 500 will now be described.

In operation 505 the substrate 102 is loaded in the processing chamber 200. In an operation 510 a plasma containment ring 202, 402 and an inner containment 204, 204A, 204B, 404 is placed over a selected portion of the substrate 102 to define a plasma containment region 214. The selected portion of the substrate 102 is less than the entire surface of the substrate.

In an operation 515, process gases are injected into the plasma containment region 214. In an operation 520, the top electrode 104 and/or the bottom electrode 106 are biased to form a plasma 201 in the plasma containment region 214.

In an operation 525 plasma byproducts process are exhausted around or through the plasma containment ring 202, 402 and the inner containment 204, 204A, 204B, 404 to the pumps 108.

In an operation 530, the plasma containment ring 202, 402 and the inner containment 204, 204A, 204B, 404 is rotated relative to the substrate 102 such that the plasma containment region 214 passes over the entire surface of the substrate.

A total process time is an integral number of rotation periods of the plasma containment region 214 relative to the surface of the substrate 102. Where: T(total)=n×T(period). The etch time can be adjusted Maintaining T(total)>>T(period), and n large provides finer adjustments of etch time. T(total) can vary from one application to another. By way of example, between less than about 20 seconds and more than about 600 seconds. However, a larger T(period) can reduce mechanical issues such as excessive angular momentum or friction, etc. By way of example, T(period) can be between greater than about 0.1 second and less than about 5.0 seconds. In another example, T(period) can be between greater than about 0.2 second and less than about 2.0 seconds.

FIG. 6 is a block diagram of an integrated system 600 including one or more of the plasma processing chambers 200, 200', 200", 200''', 300, 400, in accordance with an embodiment of the present invention. The integrated system 600 includes the one or more of the plasma processing chambers 200, 200', 200", 200''', 300, 400, and an integrated system controller 610 coupled to the processing chamber(s). The integrated system controller 610 includes or is coupled to (e.g., via a wired or wireless network 612) a user interface 614. The user interface 614 provides user readable outputs and indications and can receive user inputs and provides user access to the integrated system controller 610.

The integrated system controller 610 can include a special purpose computer or a general purpose computer. The integrated system controller 610 can execute computer programs 616 to monitor, control and collect and store data 618 (e.g., performance history, analysis of performance or defects, operator logs, and history, etc.) for the plasma chamber(s). By way of example, the integrated system controller 610 can adjust the operations of the plasma chamber(s) and/or the components therein (e.g., the edge containment ring, pressures, flow rates, bias signals, loading and unloading of the substrate 102, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code on a computer readable medium and/or logic circuits. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma process chamber comprising:
   a top electrode;
   a bottom electrode disposed opposite the top electrode, the bottom electrode capable of supporting a substrate;
   a plasma containment structure defining a plasma containment region, the plasma containment region being less than an entire surface of the substrate, wherein the plasma containment structure rotates relative to the substrate and wherein the plasma containment region includes a center point of the substrate throughout the rotation of the plasma containment structure relative to the substrate;
   a plurality of gaps in the plasma containment structure; and
   a vacuum source coupled to the plurality of gaps in the plasma containment structure.

2. The chamber of claim 1, wherein the plasma containment structure includes a containment ring and an inner containment.

3. The chamber of claim 1, wherein the top electrode is coupled to a top electrode bias potential and the bottom electrode is coupled to bottom electrode bias potential.

4. The chamber of claim 3, wherein at least one of the top electrode bias potential and the bottom electrode bias potential is applied to the respective top electrode and bottom electrode only within the plasma containment region.

5. The chamber of claim 1, wherein the plurality of gaps in the plasma containment structure determines a greater first pressure of one or more process gas in the plasma containment region and a lesser second pressure of a remaining portion of the process chamber outside the plasma containment region.

6. The chamber of claim 5, wherein the first pressure is at least twice the second pressure.

7. The chamber of claim 1, wherein the top electrode is coupled to at least one process gas source and the top electrode includes a plurality of gas inlet ports.

8. The chamber of claim 7, wherein a first portion of the plurality of gas inlet ports are open and a second portion of the plurality of gas inlet ports are closed, the first portion being disposed within the plasma containment region and the second portion being disposed within a remaining portion of the process chamber outside the plasma containment region.

9. The chamber of claim 1, wherein the containment structure includes a containment angle of between about 30 degrees and about 330 degrees.

10. The chamber of claim 1, wherein a first portion of the plurality of gaps in the plasma containment structure are formed between the plasma containment structure and the lower electrode.

11. The chamber of claim 10, wherein a second portion of the plurality of gaps in the plasma containment structure are formed in the plasma containment structure.

12. The chamber of claim 1, wherein the plasma containment structure includes an inner containment extension, the inner containment extension extending from the plasma containment structure between the top electrode and the bottom electrode in a remaining portion of the process chamber outside the plasma containment region.

13. The chamber of claim 1, wherein the plasma process chamber is included in an integrated system including an integrated system controller coupled to the plasma process chamber, the integrated system controller including:
   a user interface;
   logic for monitoring and controlling the plasma process chamber; and logic for collecting, storing, displaying, and analyzing data from the plasma process chamber.

14. A plasma process chamber comprising:
a top electrode;
a bottom electrode disposed opposite the top electrode, the bottom electrode capable of supporting a substrate;
a plasma containment structure defining a plasma containment region, the plasma containment region being less than an entire surface of the substrate, wherein the plasma containment structure rotates relative to the substrate and wherein the plasma containment region includes a center point of the substrate throughout the rotation of the plasma containment structure relative to the substrate, wherein plasma containment structure include a containment ring and an inner containment, wherein the containment structure includes a containment angle of between about 30 degrees and about 330 degrees;
a plurality of gaps in the plasma containment structure, wherein the plurality of gaps in the plasma containment structure determines a greater first pressure of one or more process gas in the plasma containment region and a lesser a second pressure of a remaining portion of the process chamber outside the plasma containment region; and
a vacuum source coupled to the plurality of gaps in the plasma containment structure.

* * * * *